United States Patent [19]

Schweitzer, Jr.

[11] Patent Number: 5,070,301
[45] Date of Patent: Dec. 3, 1991

[54] FAULT INDICATOR HAVING LIQUID CRYSTAL STATUS DISPLAY

[76] Inventor: Edmund O. Schweitzer, Jr., 2433 Center St., Northbrook, Ill. 60062

[21] Appl. No.: 577,079

[22] Filed: Aug. 31, 1990

Related U.S. Application Data

[63] Continuation of Ser. No. 433,673, Nov. 8, 1989, abandoned.

[51] Int. Cl.⁵ .................. G01R 31/02; G08B 21/00
[52] U.S. Cl. ..................... 324/509; 324/133; 324/126; 324/556; 340/664
[58] Field of Search ............... 324/96, 126, 127, 133, 324/72, 509, 539, 542, 555, 556; 350/331 R, 332, 352; 340/811, 784, 660, 662, 664

[56] References Cited

U.S. PATENT DOCUMENTS

| | | | |
|---|---|---|---|
| 3,614,610 | 10/1971 | Legatti | 324/115 |
| 3,660,757 | 5/1972 | Winslow | 324/122 |
| 3,667,039 | 4/1972 | Garfein et al. | 324/92 |
| 3,774,195 | 11/1973 | Schulthess et al. | 340/324 |
| 3,906,477 | 9/1975 | Schweitzer, Jr. | 340/253 |
| 4,139,820 | 2/1979 | Rode | 324/133 |
| 4,152,639 | 5/1979 | Chaffee | 324/51 |
| 4,152,643 | 5/1979 | Schweitzer, Jr. | 324/120 |
| 4,251,770 | 2/1981 | Schweitzer, Jr. | 324/133 |
| 4,259,634 | 3/1981 | Okamoto et al. | 324/74 |
| 4,263,550 | 4/1981 | Schweitzer, Jr. | 324/133 |
| 4,301,407 | 11/1981 | Koslar | 324/96 |
| 4,438,403 | 3/1984 | Schweitzer, Jr. | 324/133 |
| 4,458,198 | 7/1984 | Schweitzer, Jr. | 324/133 |
| 4,495,489 | 1/1985 | Schweitzer, Jr. | 340/664 |
| 4,503,389 | 3/1985 | Singer | 324/133 |
| 4,550,288 | 10/1985 | Schweitzer, Jr. | 324/133 |
| 4,559,496 | 12/1985 | Harnden, Jr. et al. | 324/127 |
| 4,641,220 | 2/1987 | Schweitzer, Jr. | 361/187 |
| 4,686,518 | 8/1987 | Schweitzer, Jr. | 340/664 |
| 4,714,916 | 12/1987 | Schweitzer, Jr. | 340/664 |
| 4,794,329 | 12/1988 | Schweitzer, Jr. | 324/127 |
| 4,794,332 | 12/1988 | Schweitzer, Jr. | 324/133 |
| 4,823,078 | 4/1989 | Mohebban | 324/133 |

FOREIGN PATENT DOCUMENTS 1011161 12/1948 France .
1199016 7/1970 United Kingdom .

OTHER PUBLICATIONS

"Liquid Crystal Display", a publication of Hamlin Inc., Lake and Grove Streets, Lake Mills, Wis., circa Jun. 1, 1989.
"Electronically Scanned Analog Liquid Crystal Displays", by R. A. Soref, *Applied Optics*, Jun. 1970, vol. 9, No. 6.

*Primary Examiner*—Jack B. Harvey
*Attorney, Agent, or Firm*—Lockwood, Alex, Fitzgibbon & Cummings

[57] ABSTRACT

A fault indicator for indicating the occurrence of a fault current in a monitored electrical conductor of an AC power distribution system utilizes a liquid crystal display having independent "F" and "N" display elements. A rectifier circuit capacitively coupled to the conductor charges a first capacitor in the presence of voltage on the conductor. A second capacitor is connected to the first capacitor by a first reed switch in magnetic communication with the conductor. Upon occurrence of a fault current the reed switch closes and a portion of the charge on the first capacitor is transferred to the second capacitor, which is connected to the "F" display segment electrodes of the liquid crystal display to cause an "F" to be displayed. The fault indication can be reset either by the slow discharge of the second capacitor, or by discharging the second capacitor through a second reed switch manually actuated by a magnetic reset tool from outside the fault indicator housing. The "N" display segment electrodes are capacitively coupled to the monitored conductor and system ground to provide an "N" display indicating that voltage is present on the conductor.

34 Claims, 5 Drawing Sheets

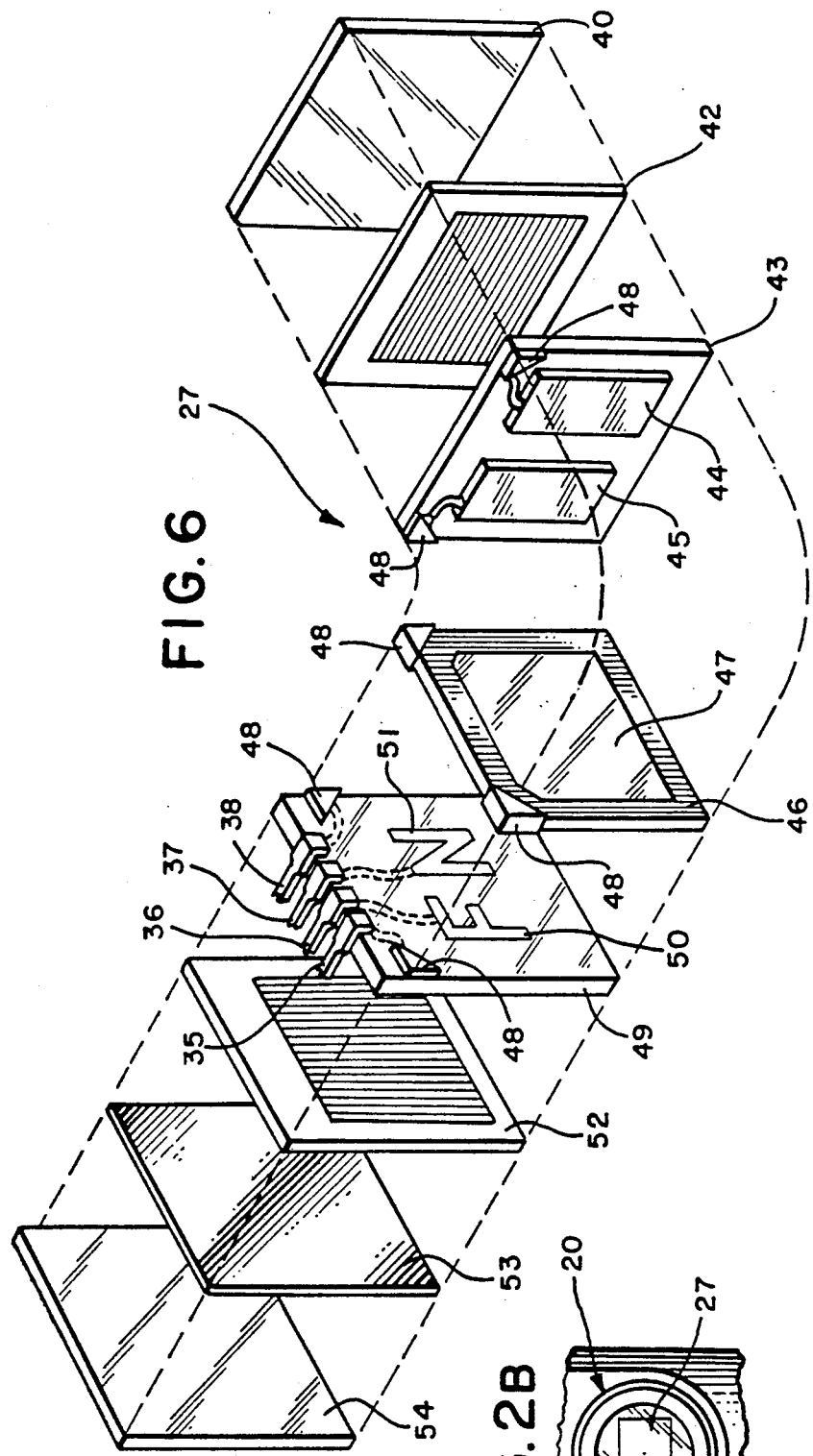
FIG. 6
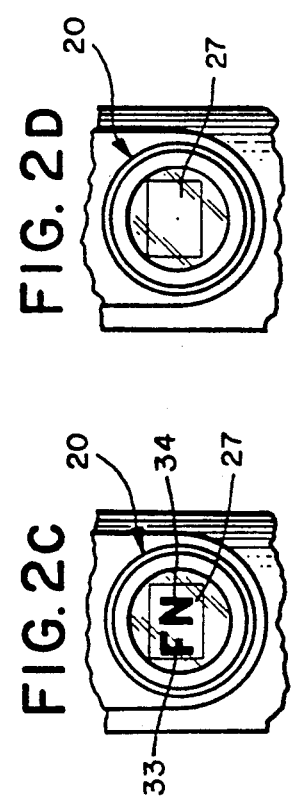
FIG. 2B
FIG. 2C
FIG. 2D

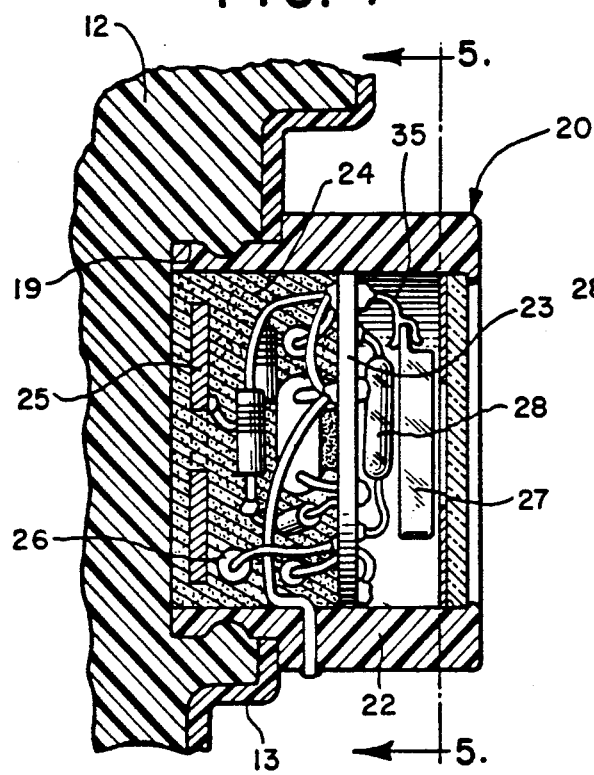
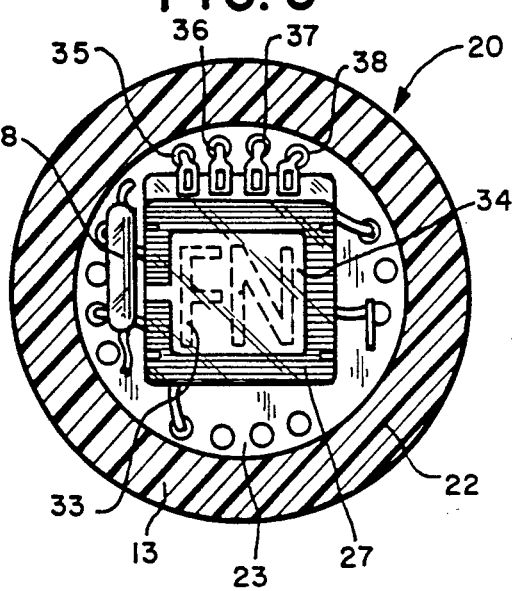
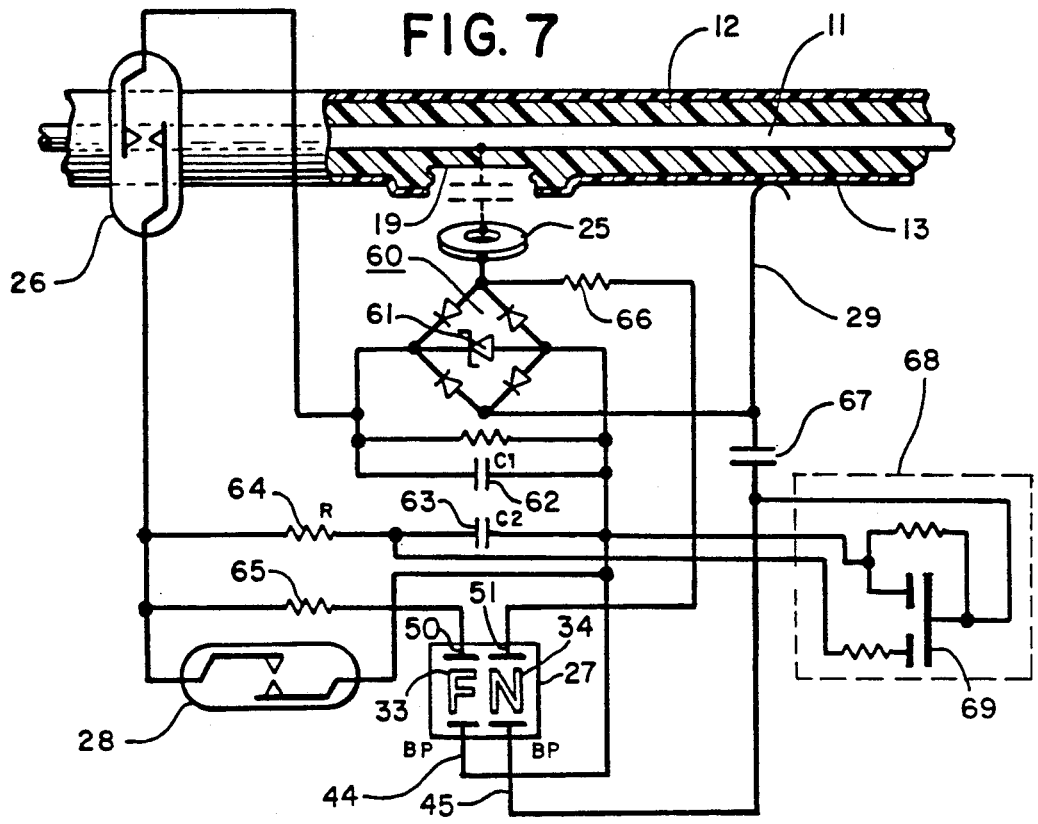

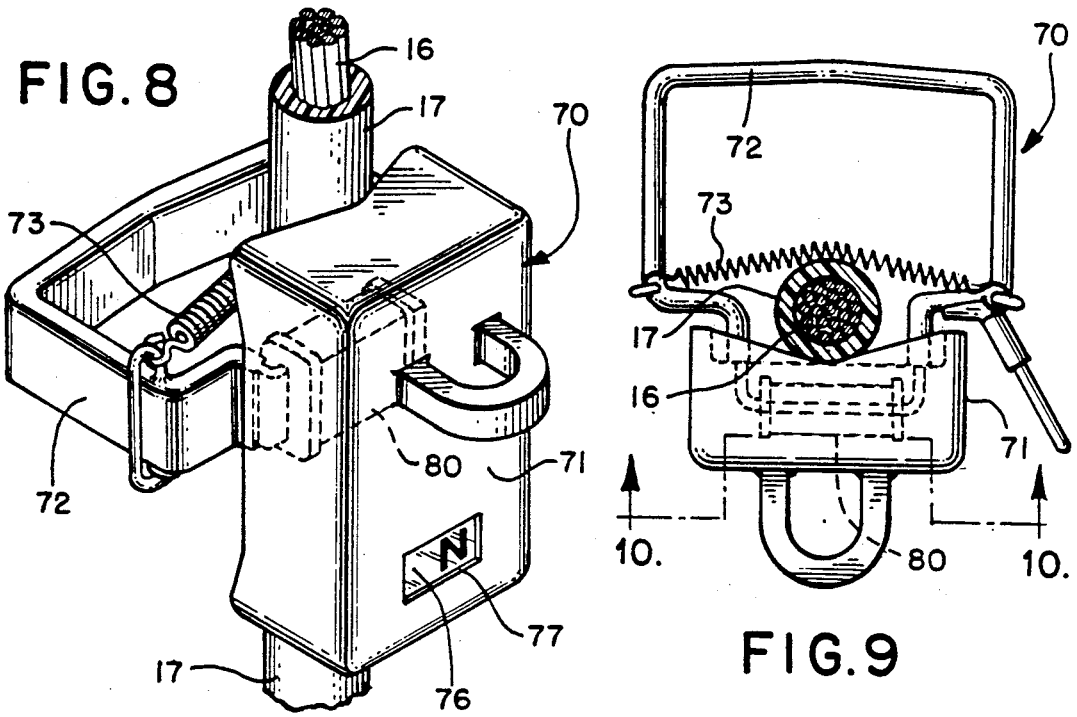
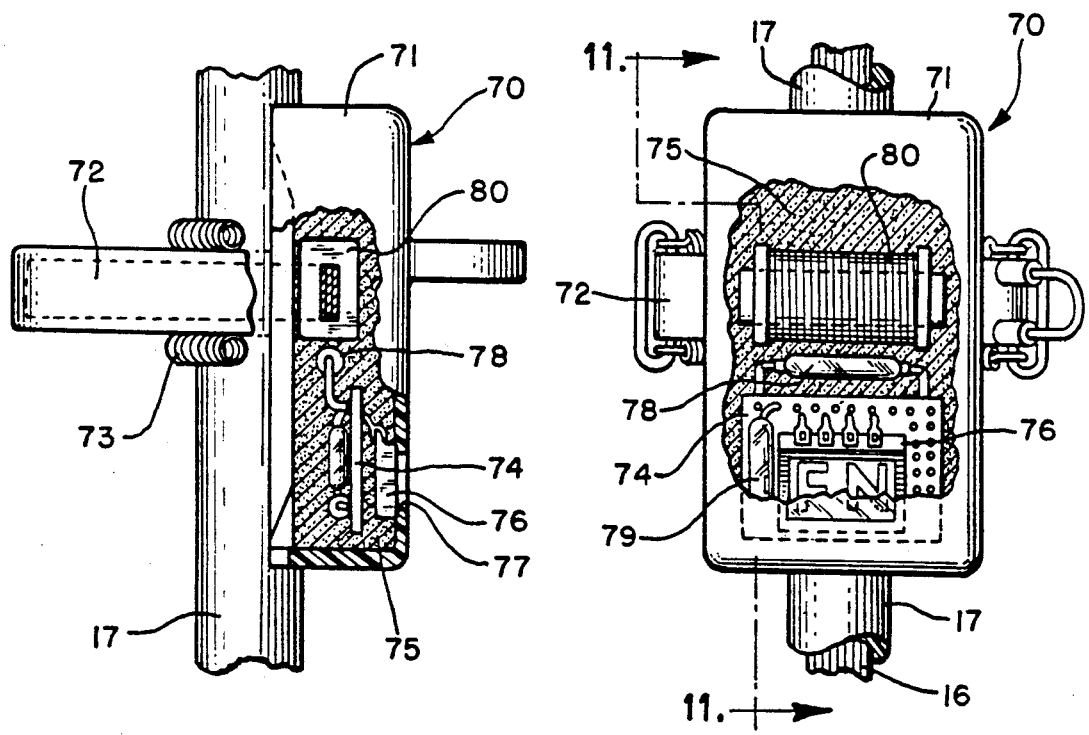

FAULT INDICATOR HAVING LIQUID CRYSTAL STATUS DISPLAY

This application is a continuation of application Ser. No. 433,673, filed Nov. 8, 1989, now abandoned.

BACKGROUND OF THE INVENTION

The present invention is generally directed to circuit monitoring devices, and more particularly, to an improved fault indicator.

Various types of fault indicators have been constructed for detecting electrical faults in power distribution systems, including clamp-on type fault indicators, which clamp over a cable of the system and derive their operating power from the magnetic field surrounding the cable, and test-point mounted type fault indicators, which attach to test point sockets provided on connectors or other system components and derive their operating power by means of a capacitive coupling to the monitored conductor. In addition, either type of fault indicator may be either self-resetting, wherein the fault indication is automatically reset following resumption of current flow in the condictor, or manually reset, wherein an operator must manually clear a fault indication.

In previous fault indicators of either type detection and indication of fault currents has typically been accomplished by circuitry including a reed switch positioned in close proxmity to the monitored conductor, and an electromagnetic indicator actuated by the circuitry to either fault or reset indicating positions. Upon occurrence of a fault current, the reed switch closes momentarily and a current is caused to flow through a magnetic winding to magnetize a magnetic pole assembly, which magnetically positions a movable indicator, typically a rotatably mounted flag member visible from the exterior of the indicator housing, to a fault-indicating position. In self-resetting indicators, a reset current remagnetizes the magnetic pole assembly to reposition the flag member to a reset-indicating position.

The use of electromagnetic indicators in such prior fault indicators, while providing satisfactory performance, undesirably complicated their manufacture by requiring the fabrication, assembly and adjustment of a number of precision parts of different materials. Moreover, the physical size of practical electromagnetic indicators prevented a desired reduction in the size of prior fault indicators, and such electromagnetic indicators could not readily provide an indication to the user as to whether the monitored conductor was powered.

The present invention overcomes these drawbacks by providing a fault indicator which incorporates a high impedance non-mechanical electronic indicator in the form of a liquid crystal display. This results in an improved fault indicator which is more compact and easier to manufacture, and which provides in a preferred construction an indication to the user as to whether the monitored line is powered.

Accordingly, it is a general object of the present invention to provide a new and improved fault indicator.

It is a more specific object of the present invention to provide a fault indicator which avoids the use of electromechanical indicator mechanisms.

It is a still more specific object of the invention to provide a fault indicator which is more compact and easier to manufacture.

It is a still more specific object of the invention to provide a fault indicator which provides both, fault and line powered circuit status indications.

SUMMARY OF THE INVENTION

The invention is directed to a fault indicator for indicating the occurrence of a fault current in a monitored electrical conductor, which includes a housing, status indicating means within the housing comprising a high impedance display device having at least a pair of electrodes in operative association with a layer of voltage-responsive light controlling material, such as a liquid crystal material. The display device provides on the exterior of the housing a first display in the absence of an actuating signal applied to the display electrodes, and a second display in the presence of an actuating signal applied to the display electrodes, and circuit means including a voltage source for applying an actuating signal to the electrodes of the liquid crystal display device following occurrence of a fault current in the monitored conductor to condition the display device to the second display condition to indicate the occurrence of the fault current.

The invention is further directed to a fault indicator as described above wherein the voltage source comprises charge storage means, and the circuit means further include a charge current source and switch means rendered conductive upon the occurrence of a fault current in the momentarily monitored conductor for transferring a charge from the charge current source to the charge storage means.

The invention is further directed to a fault indicator as described above wherein the electrical conductor comprises part of an alternating current power distribution system, and wherein the charge current source comprises additional charge storage means, and the circuit means further include rectifier means for applying a direct current derived from alternating current on the monitored conductor to the additional charge storage means.

The invention is further directed to a fault indicator as described above wherein the liquid crystal display device includes an additional display and associated second pair of electrodes, and wherein the circuit means include means for applying an actuating signal to the second pair of electrodes in the presence of voltage on the monitored conductor.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 2B is a partial front elevational view similar to FIG. 2A showing a fault and unpowered indication of the fault indicator.

FIG. 2C is a partial front elevational view similar to FIG. 2A showing a fault and powered indication of the fault indicator.

FIG. 2D is a partial front elevational view similar to FIG. 2A showing a reset and unpowered indication of the fault indicator.

FIG. 4 is an enlarged cross-sectional view of the fault indicator installed in the test point socket.

FIG. 5 is a cross-sectional view of the installed fault indicator taken along line 5—5 of FIG. 4.

FIG. 6 is an enlarged exploded perspective view showing the principal elements of the liquid crystal display component utilized in the fault indicator of FIGS. 1-5.

FIG. 7 is an electrical schematic diagram of the fault indicator of FIGS. 1-5.

FIG. 8 is a perspective view of a clamp-on current-powered type fault indicator installed on a power distribution cable.

FIG. 9 is a top plan view of the fault indicator of FIG. 8 showing the engagement between the fault indicator and the cable.

FIG. 10 is a cross-sectional view of the fault indicator of FIGS. 8 and 9 taken along line 10—10 of FIG. 9.

FIG. 11 is a cross-sectional view of the fault indicator of FIGS. 8-10 taken along line 11—11 of FIG. 10.

DESCRIPTION OF THE PREFERRED EMBODIMENT

Figures 1, 2A, 3:
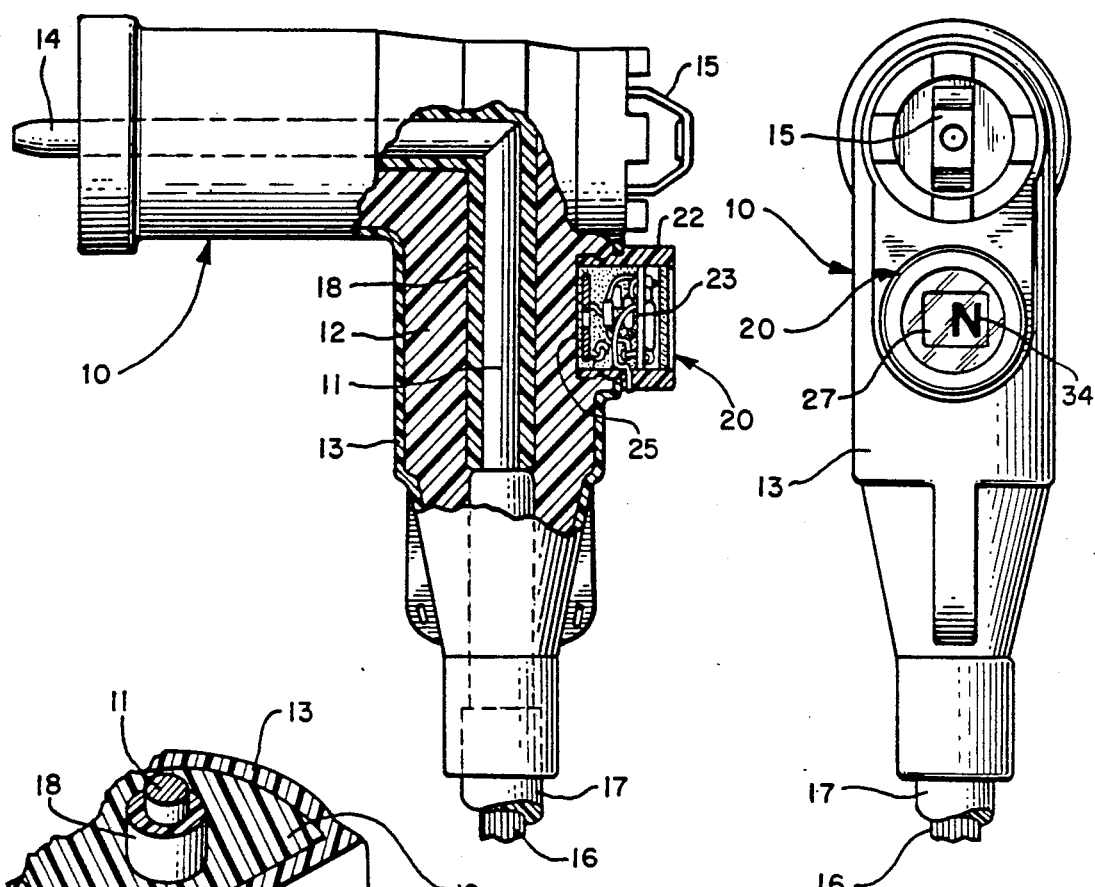
FIG. 1 is a side elevational view, partially in section, showing a fault indicator constructed in accordance with the invention installed in a connector test point socket in a power distribution system.
FIG. 2A is a front elevational view of the fault indicator and connector of FIG. 1 showing a reset and powered indication of the fault indicator.
FIG. 3 is an enlarged exploded perspective view of the fault indicator and certain principal components thereof shown relative to the test point socket.

Referring to the drawings, and particularly to FIGS. 1-4, a plug-in type elbow connector for use in high voltage alternating current power distribution systems for establishing a plug-in connection to a transformer or other system component (not shown) is identified generally by reference numeral 10. As shown, the connector 10 includes generally a conductor 11 extending generally axially through an electrically non-conductive body portion 12 encased in an electrically-conductive sheath 13, the sheath being grounded in accordance with conventional practice. An electrically-conductive contact member 14 extends from conductor 11 to mate with a complementary contact on the associated system component. An arcuate member 15 having ends anchored in the conductive sheath 13 extends from the connector to receive the hooked end of a lineman's tool. The axial conductor 11 is connected, in accordance with conventional practice, to the conductor 16 of a flexible cable 17 of the type commonly utilized in power distribution systems. A layer 18 of semi-conductive material may be provided around conductor 11 to provide stress relief for the electric field within the connector in a manner well known to the art.

To provide for detecting fault currents or voltage presence in conductor 11 connector 10 includes a test point socket 19 for receiving a fault indicator module 20. The test point socket 19, which is preferably constructed as described in the copending application for U.S. Letters Patent of the present applicant, Ser. No. 253,427, filed Oct. 4, 1988, is formed within the insulating body portion of the connector, extending through the electrically-conductive outer sheath 13. In particular, this socket is preferably cylindrical in form and of an axial extent such that the test point socket 19 receives a substantial portion of the fault indicator housing.

The fault indicator module 20 is seen in FIGS. 3-5 to include a generally cylindrical housing 22 formed of an electrically conductive rubber or similar material semi-resilient within which the electrical components of the fault indicator are contained. In particular, within housing 22 the fault indicator module includes a disc-shaped insulator board 23 positioned perpendicularly to the axis of the housing at a location intermediate the ends thereof, and a layer 24 (FIG. 4) of high electrical resistance potting compound at the inside end of the housing for securing the insulator board in place. Additional electrical components included in housing 22 include, in accordance with the invention, a capacitive coupling element in the form of a metallic plate 25 for capacitively coupling the circuitry of the fault indicator to conductor 11, a first reed switch 26 aligned tangentally to the monitored conductor for sensing the occurrence of a fault current in the conductor, a high impedance electronic display component 27 for visually indicating the occurrence of a fault current, and an optional second reed switch 28 aligned parallel to the monitored conductor for manually resetting a fault condition.

Operating power for the circuitry of fault indicator module 20 is derived from conductor 11 by means of the metallic plate 25, which when module 20 is seated in test point socket 19 is sufficiently closely spaced to the conductor to provide a level of capacitive coupling whereby an adequate alternating voltage is derived from the conductor. A necessary ground return for this circuitry may be provided, as shown in FIGS. 1-5, by an electrical conductor 29 which extends through an aperture 21 in the sidewall of housing 22. When housing 22 is seated in test point socket 19 conductor 29 is brought into electrical communication with the electrically grounded sheath 13 of the connector.

As shown in FIGS. 3 and 4, within housing 22 the liquid crystal display component 27 is positioned against a transparent window 30 such that the indicator face of the component is readily viewable from the exterior of the housing. A mask 31 formed of a thin sheet of opaque material may be provided on the inside surface of window 30 so that only the indicator face can be seen.

As shown in FIG. 5, the liquid crystal display component 27 is capable of independently producing an "F" display 33 to indicate a fault occurrence, and an "N" display 34 to indicate the presence of voltage on conductor 11. Electrical connections are made with the component by means of four electrically conductive terminals 35-38 arranged along the top edge of the component.

Internally, as shown in FIG. 6, the liquid crystal display component 27 generally includes a transparent face plate 40, a front polarizer 42, a glass plate 43 on which a pair of transparent backplane electrodes 44 and 45 are provided, a perimeter seal 46 containing a layer 47 of twisted nematic liquid crystal material, electrically conductive edge contacts 48, a glass plate 49 on which a pair of transparent indicator segment electrodes 50 and 51 are contained, a rear polarizer 52 aligned at right angles to front polarizer 42, a reflector 53 and a rear supporting plate 54.

Display component 27 is conventional in construction and operation. The "F" and "N" displays are formed by the nematic liquid crystal layer 47, which in the absence of an applied electric field has the property of rotating the polarization of light as it passes through the molecular layers of the layer. In particular, as randomly polarized light enters the display component through face plate 40, only vertically polarized light passes through front polarizer 42. In the absence of an applied electric field, the polarization of this polarized light is rotated 90° as it passes through the nematic liquid crystal layer 47 and reaches rear polarizer 50. Since the polarization of the light has been rotated the light is able to pass through this polarizer onto the reflective layer 51, wherein it is reflected back through polarizer 50, rotated by liquid crystal layer 47 and passed through polarizer 42 to front plate 40 and window 30. Thus, in the absence of an applied electric field light entering face plate 40 is passed through the device and reflected back out, presenting a blank or white colored appearance to the observer.

By applying an electric field between indicator segment electrodes 50 and 51 and their associated backplane electrodes 44 and 45 the liquid crystal layer in its intervening portions is caused to pass incoming light without rotating its polarization, thereby selectively blocking the transmission and reflection of light to the viewing window 30 in the "F" or "N" patterns and causing these characters to be displayed to a viewer as darkened letters.

An electric field is established to generate the "F" display by applying a signal to contacts 35 and 36, which connect to respective ones of display electrodes 44 and 50, and through connections 37 and 38, which connect to display electrodes 51 and 45, respectively. Consequently, by applying a signal between contacts 36 and 35 the "F" display 33 is caused to appear at face plate 40, and by applying a signal between terminals 37 and 38 the "N" display 34 is caused to appear.

Referring to FIG. 7, the necessary signals for actuating the "F" and "N" displays are provided by a circuit within housing 22. In particular, the circuit includes a full-wave bridge rectifier 60 having one input terminal connected to the capacitive coupling plate 25 and its other input terminal connected to ground through ground lead 29. Thus connected the bridge rectifier network is capacitively coupled to the monitored conductor 11 and produces as a result of AC voltage on that conductor a direct current at its output terminals. The output terminals are connected to charge storage means in the form of a capacitor 62 which develops a charge at a voltage level dependent on a zener diode 61 connected across the capacitor.

Upon occurrence of a fault current, capacitor 62 is momentarily connected by reed switch 26 to additional charge storage means in the form of a display capacitor 63 such that a portion of the charge on capacitor 62 is transferred to capacitor 63. A series-connected resistor 64 serves to reduce the rate at which the charge is transferred to prevent damage to the switch contacts from excessive current flow. The voltage developed across display capacitor 63 as a result of the transferred charge serves as a voltage source, providing a voltage signal which is applied to the "F" display electrodes of display component 27 through a resistor 65 such that the display component displays an "F" character to the user. This display continues until the charge on capacitor 63 depletes with time to a voltage level insufficient to maintain the alignment of the molecules in the nematic liquid crystal layer. In practice, capacitor 63 will have sufficient charge to maintain the fault indication for up to 36 hours, this time being primarily dependent on the net charge transferred to the capacitor and the internal leakage of the capacitor. A lesser duration may be provided if desired by increasing the current drain from the capacitor.

In further accord with the invention, fault indicator 20 may provide an "N" segment display to indicate the presence of operating voltage on monitored conductor 11. In particular, this is accomplished by connecting the "N" display electrodes 45 and 51 of display component 27 to the capacitive coupling plate 25 through a resistor 66 and coupling capacitor 67. In the presence of alternating current on the monitored conductor the "N" display 34 appears and the user is informed that the conductor is powered.

It will be noted that the "F" display 33 is controlled by direct current supplied by capacitor 63, whereas the "N" display 34 is powered by alternating current derived through resistor 66 and capacitor 67. Thus, the two displays are independent of each other.

Once the fault indication has occurred, should it be desired to cancel the "F" indication, as for example when re-powering the affected circuit after a transient fault, it is only necessary to discharge capacitor 63 by actuating the optionally provided manual reset reed switch 28 by momentarily applying a magnetic field at the exterior of the housing. To this end, the reed switch is preferably located at an accessible location near the front face plate of the housing, with its axis aligned generally parallel to the axis of conductor 11 so that the switch will not be actuated by fault currents in the conductor.

In many applications it is desirable that following a fault occurrence a fault indicator be self resetting, i.e., automatically return to a reset state upon restoration of voltage to the monitored conductor. As shown in FIG. 7, this may be accomplished by providing an optional reset circuit 68 which includes a field effect transistor (FET) 69 having principal source and drain electrodes connected through a resistor to capacitor 63, and a high impedance gate electrode coupled to the monitored AC conductor through the "N" display circuit.

Upon restoration of voltage in the conductor, FET 69 is caused to conduct and discharge capacitor 63. The fixed series resistance reduces the rate discharge through the principal electrodes of FET 69 to preclude capacitgor 63 from being discharged during a fault, prior to interruption of voltage on the monitored conductor, as well as preventing the discharge current from exceeding the limits of the FET. An additional resistor connected between the drain and gate electrodes biases the device to a cut-off state in the absence of a signal on the gate electrode.

The invention may also be utilized in a current-powered application. Referring to FIGS. 8-11, a current-actuated fault indicator 70 constructed in accordance with the invention may include a generally rectangular housing 71 secured to a monitored cable 17 by means of a resilient magnetic pole assembly 72 which encircles the cable. The magnetic pole assembly is held in a closed position by a spring 73 which secures cable 17 against a V-shaped recess in the housing.

Within housing 71 fault indicator 70 includes a circuit board 74 on which the principal components of the indicator are mounted. A layer of potting compound 75 seals the circuit board within the housing. Circuit status is indicated by a high impedance liquid crystal display component 76, which is mounted on the circuit board and may be identical in construction and operation to the component 27 previously described. Component 76 is positioned behind a viewing window 77 such that the "F" and "N" displays of the component can be readily observed from the exterior of the housing. A first reed switch 78 aligned generally tangentially to the monitored conductor senses the occurrence of fault currents in the conductor. An optional second reed switch 79 aligned generally parallel to the axis of the monitored conductor allows the user to reset a fault indication by means of an external magnet.

Figure 12:
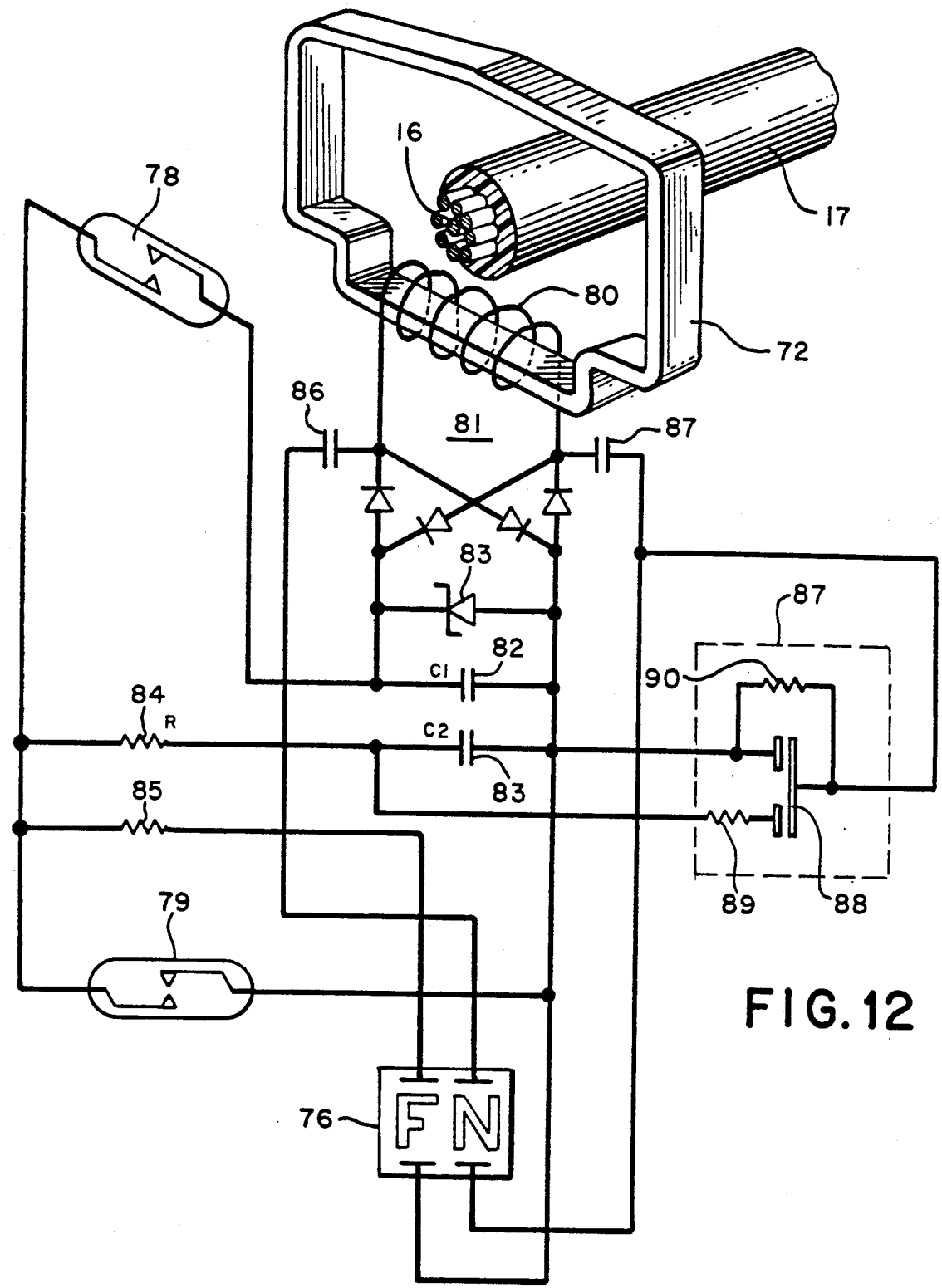
FIG. 12 is an electrical schematic diagram of the fault indicator of FIGS. 8-11.

Operating power for the circuitry of fault indicator 70 is obtained by means of a winding 80 disposed on magnetic core 72 within housing 71. In the presence of alternating current in the monitored conductor a current is induced in winding 80. As shown in FIG. 12, the induced alternating current is supplied to the input terminals of a bridge rectifier network 81, wherein it is rectified to develop a charge within a capacitor 82. A zener diode 83 connected across this capacitor limits the voltage developed across the capacitor.

Upon occurrence of a fault current in the monitored conductor, reed switch 78 momentarily closes and a portion of the charge developed in capacitor 82 is conveyed through the switch to a second capacitor 83. Capacitor 83 is connected to the "F" display electrodes of display component 76 such that the display component is caused to display the character "F" to the user to signify that a fault has occurred. A resistor 84 is connected in series with capacitor 83 to limit current flow through the switch contacts, and a resistor 85 is connected in series with the "F" display electrodes. In practice, the "F" display may last 36 hours or more, depending primarily on the charge transferred to capacitor 83 and the internal leakage current of the capacitor. Capacitor 83 may be discharged by the user at any time by actuation of the optional reed switch 79 by means of an external magnet.

The "N" display of display component 76 may be actuated by the current induced in winding 80 when the monitored conductor 16 is powered. A pair of capacitors 86 and 87 connect the "N" display electrodes to winding 80 to this end.

Thus, in the manner of the previously described capacitively coupled fault indicator application of FIGS. 1-7, upon occurrence of a fault an "F" indication is provided which indicates to the user that a fault has occurred. This indication remains until the reset switch 79 has been actuated by the user, or until capacitor 83 discharges to a voltage level below that sufficient to maintain the indication on display component 76. An "N" indication appears whenever the monitored conductor is energized.

Automatic resetting of fault indicator 70 may be achieved by means of an optional reset circuit 87 similar to the previously described reset circuit 68. In particular, the reset circuit may include an enhanced FET 88 having principal source and drain electrodes connected to capacitor 83 through a current limiting resistor 89, and the high impedance gate electrode may be coupled to winding 80 through the "N" display capacitor 87, or through an additional capacitor, and biased to cut-off by a resistor 90. Upon restoration of current in conductor 16, FET 88 is rendered conductive and capacitor 83 is discharged to terminate the "F" indication.

While the use of other types of high impedance voltage-actuated light controlling evices is possible, liquid crystal display (LCD) components, because of their extremely high input impedance, are particularly well adapted to the invention. The high input impedance of these devices, typically in excess of $10 \times 10^{-15}$ ohms, results in a very low current drain from the display capacitor. This allows the capacitor to retain sufficient charge for operating the display over an extended period, typically in excess of 36 hours, limited primarily by the internal leakage current of the capacitor. In practice, this is more than sufficient time for a repair crew to locate and repair a fault, even in a large distribution system. A lesser reset time may in fact be preferred in some applications.

Furthermore, depending on the particular liquid crystal material used, LCD components exibit a well defined threshold voltage over a wide range of ambient temperatures below which the display does not respond to an applied signal. In one successful embodiment of the invention using a Type 7 twisted nematic field effect LCD manufactured by Hamlin, Inc. of Lake Mills, Wis., U.S.A., this threshold is 2.0 volts, which is sufficiently high to prevent the display from falsely responding to residual voltages, but not so high as to require an undesirably large charge on the display capacitor.

In operation, upon occurrence of a fault current, a charge $Q_T$ equal to $$\left[ \frac{C_2}{C_1 + C_2} \right] \times Q_1$$

is transferred, where $C_1$ is the current source capacitor, $C_2$ is the display capacitor, and $Q_1$ is the charge on $C_1$. The capacitance of $C_1$ is preferably selected to be smaller than the capacitance of $C_2$ so that the RC time constant of the transfer circuit can be approximately one millisecond. For example, for a source capacitor $C_1$ of 0.8 microfarad, a display capacitor $C_2$ of 2.0 microfarad, and a series resistance of 1250 Ohms, 63% of the transferred charge $Q_T$ is transferred in one millisecond. With a typical 30 volt charge on $C_1$, a peak current of 24 milliamperes results, which is within the current rating of a conventional reed-type switch.

Capacitor $C_1$, when charged to 30 volts, has a net charge $Q_1$ of 24 microcoulombs. Upon closure of the reed switch, the voltage across the parallel combination reduces to $$\frac{Q_1}{C_1 + C_2},$$

or 8 volts. When the reed switch opens, $C_2$ is isolated with a charge of 17.6 microcoulombs at 8 volts, which is sufficient to maintain the "F" display for 6 hours when discharging through a 200 megohm resistance. It will be appreciated that a greater or lesser display duration is possible by varying the charge on $C_1$ or $C_2$, or the net discharge impedance, including the internal leakage impedance of $C_2$.

The invention provides a redily comprehended display of circuit status:

| Display | Condition |
| --- | --- |
| Blank | No fault, no system voltage |
| "N" | No fault, system energized |
| "F" | Fault occurrence, no system voltage |
| "FN" | Fault occurred and cleared, system voltage restored |

Thus, unlike prior fault indicators which indicated fault occurrence only, the fault indicator of the invention provides a complete indication of circuit status, without the use of electromechanical indicating mechanisms and in a more compact and efficient construction.

While "F" and "N" displays have been shown, it will be appreciated that other display characters, or symbols, can be used instead. For example, the "F" can be replaced with an "S" (for "short-circuit") or a downardly pointing arrow symbol, and the "N" can be replaced with an "HL" (for "hot line") or a lightning bolt symbol.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for indicating the occurrence of a fault current in a monitored electrical conductor, comprising:
   a housing;
   status indicating means within said housing comprising a high impedance display device having at least a pair of display electrodes disposed in operative association with a layer of voltage-responsive light controlling material, the display device providing on the exterior of said housing a first display condition in the absence of an actuating signal applied to said electrodes, and a second display condition in the presence of an actuating signal applied to said electrodes;
   a capacitor connected between respective ones of said display electrodes of said display device;
   a source of unidirectional current;
   switch means responsive to the occurrence of a fault current in the monitored conductor; and
   circuit means including said switch means and said current source for applying an actuating signal to said capacitor following occurrence of a fault current in the monitored conductor to condition said display device to said second display condition to indicate the occurrence of said fault current.

2. A fault indicator as defined in claim 1 wherein said switch means are rendered conductive upon the occurrence of a fault current in the monitored conductor for transferring a charge from said current source to said capacitor.

3. A fault indicator as defined in claim 1 wherein the electrical conductor comprises part of an alternating current power distribution system, said current source comprises an additional capacitor, and said circuit means further include rectifier means for applying a unidirectional current derived from the monitored conductor to said additional capacitor.

4. A fault indicator as defined in claim 1 wherein said switch means comprise a reed switch actuated by the magnetic field accompanying the occurrence of the fault current in the monitored conductor.

5. A fault indicator as defined in claims 1, 2 or 3 wherein said high impedance display device includes a second pair of display electrodes, said display device providing a third display condition concurrently with said first or second display condition indicative of the application of an actuating signal to said second pair of display electrodes; and
   wherein said circuit means include means for applying an actuating signal derived from the monitored conductor to said second pair of display electrodes to indicate the presence of voltage on the monitored conductor.

6. A fault indicator as defined in claim 5 wherein the electrical conductor comprises part of an alternating current power distribution system, and said circuit means include means for capacitively coupling respective ones of said second pair of display electrodes to ground and to the monitored conductor.

7. A fault indicator as defined in claim 5 wherein said high impedance display device comprises a liquid crystal display having at least pair of display electrodes each comprising a display element electrode and an associated backplane electrode.

8. A fault indicator as defined in claims 1, 2 or 3 wherein said high impedance display device comprises a liquid crystal display having at least one pair of display electrodes comprising a display element electrode and an associated backplane electrode.

9. A fault indicator as defined in claims 1, 2 or 3 wherein said circuit means further include reset switch means user-actuable from the exterior of said housing for discharging said capacitor to condition said display device to said first display condition.

10. A fault indicator as defined in claim 9 wherein said reset switch means comprise a reed switch magnetically actuable from the exterior of the housing.

11. A fault indicator as defined in claim 10 wherein said reed switch is aligned generally parallel to the monitored conductor.

12. A fault indicator as defined in claims 1, 2 or 3 wherein said circuit means further include a reset circuit for automatically discharging said capacitor upon restoration of voltage in the monitored conductor to condition said display device to said first display condition.

13. A fault indicator as defined in claim 12 wherein said reset circuit comprises transistor switch means having source and drain electrodes connected across said capacitor and a high impedance control electrode responsive to the presence of voltage on the monitored conductor.

14. A fault indicator as defined in claim 13 wherein said transistor switch means comprise a field effect transistor.

15. A fault indicator for indicating the occurrence of a fault current in a monitored alternating current conductor, comprising:
   a housing;
   status indicating means within said housing comprising a high impedance display device having at least one pair of display electrodes disposed in operative association with a layer of voltage-responsive light controlling material, the display device providing on the exterior of said housing a first display condition in the absence of an actuating signal applied to said display electrodes, and a second display condition in the presence of an actuating signal applied to said display electrodes;
   a first capacitor;
   rectifier circuit means operable from the monitored conductor for charging said first capacitor;
   a second capacitor having first and second end terminals;
   switch means rendered conductive upon the occurrence of a fault current in the monitored conductor for momentarily connecting said first capacitor to said second capacitor to establish a charge in said second capacitor; and said electrodes of said display device being connected to respective ones of said end terminals of said second capacitor to condition said display device to said second display condition in the presence of said charge.

16. A fault indicator as defined in claim 15 wherein said switch means comprise a reed switch actuated by the magnetic field accompanying the occurrence of a fault current in the monitored conductor.

17. A fault indicator as defined in claim 15 wherein said high impedance display device includes a second pair of display electrodes, said display device providing a third display condition concurrently with said first or second display conditions indicative of the application of an actuating signal to said second pair of display electrodes, and
wherein said fault indicator includes means for applying an actuating signal derived from the monitored conductor to said second pair of display electrodes to indicate the presence of voltage on the monitored conductor.

18. A fault indicator as defined in claim 15 further including reset switch means user-actuable from the exterior of said housing for discharging said second capacitor to condition said display device to said first display condition.

19. A fault indicator as defined in claim 18 wherein said reset switch means comprise a reed switch magnetically actuable from the exterior of the housing.

20. A fault indicator as defined in claim 19 wherein said reed switch is aligned generally parallel to the monitored conductor.

21. A fault indicator as defined in claim 15 further including a reset circuit for automatically discharging said second capacitor upon restoration of voltage in the monitored conductor to condition said display device to said first display condition.

22. A fault indicator as defined in claim 21 wherein said reset circuit comprises transistor switch means having source and drain electrodes connected across said second capacitor and a high impedance gate electrode responsive to the presence of voltage on the monitored conductor.

23. A fault indicator as defined in claim 22 wherein said switch means comprise a field effect transistor.

24. A indicator as defined in claim 15 wherein said high impedance display device comprises a liquid crystal display having at least one pair of display electrodes including a display segment electrode and an associated backplane electrode.

25. A fault indicator for indicating the occurrence of a fault current in a monitored alternating current conductor, comprising:
a housing;
status indicating means within said housing comprising a high impedance display device having at least a pair of display electrodes disposed in operative association with a layer of voltage-responsive light controlling material, the display device providing on the exterior of said housing a first display condition in the absence of an actuating signal applied to said display electrodes, and a second display condition in the presence of an actuating signal applied to said display electrodes;
a first capacitor;
rectifier means for applying a unidirectional current derived from the monitored alternating current conductor to said first capacitor to develop a charge therein;
a second capacitor;
switch means rendered momentarily conductive by the magnetic field accompanying the occurrence of a fault current in the monitored conductor for transferring a portion of the charge on said first capacitor to said second capacitor; and
said display electrodes of said display device being connected to said second capacitor to condition said display device to said second display condition in the presence of said charge.

26. A fault indicator as defined in claim 25 wherein said switch means comprise a reed switch actuated by the magnetic field accompanying the occurrence of the fault current in the monitored conductor.

27. A fault indicator as defined in claim 25 wherein said high impedance display device includes a second pair of display electrodes, said display device providing a third display condition concurrently with said first or second display conditions indicative of the application of an actuating signal to said second pair of display electrodes, and
wherein said fault indicator further includes means for applying an actuating signal derived from the monitored conductor to said second pair of display electrodes to indicate the presence of voltage on the monitored conductor.

28. A fault indicator as defined in claim 27 further including means for capacitively coupling said second pair of display electrodes between the monitored conductor and electrical ground.

29. A fault indicator as defined in claim 25 wherein said high impedance display device comprises a liquid crystal display having at least one pair of display electrodes including display segment electrode and an associated backplane electrode.

30. A fault indicator as defined in claim 25 further including reset switch means user-actuable from the exterior of said housing for discharging said second capacitor to condition said display device to said first display condition.

31. A fault indicator as defined in claim 30 wherein said reset switch means comprise a reed switch magnetically actuable from the exterior of the housing.

32. A fault indicator as defined in claim 31 wherein said reed switch is aligned generally parallel to the monitored conductor.

33. A fault indicator as defined in claim 25 furhter including a reset circuit for automatically discharging said second capacitor upon restoration of voltage in the monitored conductor to condition said display device to said first display condition.

34. A fault indicator as defined in claim 33 wherein said reset circuit comprises transistor switch means having source and drain electrodes connected across said second capacitor and a high impedance gate electrode responsive to the presence of voltage on the monitored conductor.

* * * * *